(12) United States Patent
Curtin (10) Patent No.: US 12,226,062 B1
(45) Date of Patent: Feb. 18, 2025

(54) SQUEEGEE HOLDER WITH AN INTEGRATED CLAMP BAR

(71) Applicant: Transition Automation, Inc., Tyngsboro, MA (US)

(72) Inventor: Mark J. Curtin, Groton, MA (US)

(73) Assignee: Transition Automation, Inc., Tyngsboro, MA (US)

( * ) Notice: Subject to any disclaimer, the term of this patent is extended or adjusted under 35 U.S.C. 154(b) by 0 days.

(21) Appl. No.: 18/408,153

(22) Filed: Jan. 9, 2024

Related U.S. Application Data (60) Provisional application No. 63/438,446, filed on Jan. 11, 2023.

(51) Int. Cl.
| | |
|---|---|
| *A47L 13/11* | (2006.01) |
| *B41F 15/44* | (2006.01) |
| *B60S 1/38* | (2006.01) |
| *F16B 2/06* | (2006.01) |
| *H05K 3/34* | (2006.01) |

(52) U.S. Cl.
CPC .............. *A47L 13/11* (2013.01); *B41F 15/44* (2013.01); *B60S 2001/3812* (2013.01); *B60S 2001/3822* (2013.01); *F16B 2/06* (2013.01); *H05K 3/3485* (2020.08); *H05K 2203/0139* (2013.01)

(58) Field of Classification Search
CPC ....... A47L 13/11; B23K 3/0638; B41F 15/44; B60S 2001/3812; B60S 2001/3822; B60S 2001/3818; B60S 2001/3813
USPC ................................ 15/121, 245, 250.452
See application file for complete search history.

(56) References Cited

U.S. PATENT DOCUMENTS

| | | | |
|---|---|---|---|
| 2,359,408 A | 10/1944 | Disse | |
| 2,440,099 A * | 4/1948 | Kind | .................... A47L 1/06 |
| | | | 15/245 |
| 2,477,339 A * | 7/1949 | Ljungquist | ............ D21G 3/005 |
| | | | 15/256.51 |
| 2,783,709 A | 3/1957 | Thomas | |
| 2,863,382 A | 12/1958 | Giani | |
| 3,071,069 A | 1/1963 | Sherman | |
| 3,377,644 A | 4/1968 | Budzinski et al. | |
| 3,505,951 A | 4/1970 | Gartrell | |
| 3,619,478 A | 11/1971 | Staiger | |

(Continued)

FOREIGN PATENT DOCUMENTS

| | | |
|---|---|---|
| EP | 0003379 A1 | 8/1979 |
| GB | 2172542 A | 9/1986 |

(Continued)

OTHER PUBLICATIONS

IBM Technical Disclosure Bulletin, Card Holder and Lock, vol. 29, No. 1, Jun. 1986, pp. 182-184, 4 pages.

(Continued)

*Primary Examiner* — Tyrone V Hall, Jr.
(74) *Attorney, Agent, or Firm* — Gesmer Updegrove LLP (57) ABSTRACT

A squeegee blade holder system is disclosed that includes a squeegee blade holder comprising a first elongated recess on a front side of the squeegee blade holder for receiving a pivoting clamp bar in communication with a squeegee blade, and a second elongated recess on the front side of the squeegee blade holder for receiving a push bar for urging the pivoting clamp bar to capture the squeegee blade between the pivoting clamp bar and the front side of the squeegee blade holder.

25 Claims, 6 Drawing Sheets

(56) References Cited

U.S. PATENT DOCUMENTS

| | | | |
|---|---|---|---|
| 3,649,991 A * | 3/1972 | Grimston | D21G 3/005 |
| | | | 15/256.51 |
| 3,670,409 A | 6/1972 | Reimer | |
| 3,899,379 A | 8/1975 | Wanesky | |
| 4,023,486 A | 5/1977 | Linthicum et al. | |
| 4,146,484 A | 3/1979 | Campbell | |
| 4,248,150 A | 2/1981 | Lala | |
| 4,254,707 A | 3/1981 | Lambert et al. | |
| 4,273,655 A | 6/1981 | Reid | |
| 4,404,903 A | 9/1983 | Cronin | |
| 4,433,623 A | 2/1984 | Beckim | |
| 4,485,736 A | 12/1984 | Strutz, Jr. et al. | |
| 4,498,988 A | 2/1985 | Fujita et al. | |
| 4,729,306 A | 3/1988 | Bubley | |
| 4,759,488 A | 7/1988 | Robinson et al. | |
| 4,768,286 A | 9/1988 | Ketcham | |
| 4,778,641 A | 10/1988 | Chia | |
| 4,810,616 A | 3/1989 | Grabbe et al. | |
| 4,818,724 A | 4/1989 | Cetronio et al. | |
| 4,859,188 A | 8/1989 | Neumann | |
| 4,950,173 A | 8/1990 | Minemura et al. | |
| 4,961,893 A | 10/1990 | Rose | |
| 4,993,199 A | 2/1991 | Hughes | |
| 5,037,599 A | 8/1991 | Olson | |
| 5,044,306 A | 9/1991 | Erdmann | |
| 5,045,914 A | 9/1991 | Casto et al. | |
| 5,054,193 A | 10/1991 | Ohms et al. | |
| 5,091,769 A | 2/1992 | Eichelberger | |
| 5,095,925 A | 3/1992 | Elledge et al. | |
| 5,106,784 A | 4/1992 | Bednarz | |
| 5,107,876 A | 4/1992 | Ozyjiwsky | |
| 5,123,985 A | 6/1992 | Evans et al. | |
| 5,143,102 A | 9/1992 | Blaul | |
| 5,164,335 A | 11/1992 | Sato et al. | |
| 5,166,184 A | 11/1992 | Hashimoto et al. | |
| 5,216,278 A | 6/1993 | Lin et al. | |
| 5,218,759 A | 6/1993 | Juskey et al. | |
| 5,271,325 A | 12/1993 | Price et al. | |
| 5,301,701 A | 4/1994 | Nafziger | |
| 5,303,820 A | 4/1994 | Comtois | |
| 5,303,824 A | 4/1994 | Kohn | |
| 5,320,226 A | 6/1994 | Merrill | |
| 5,345,862 A | 9/1994 | Giard | |
| 5,353,498 A | 10/1994 | Fillion et al. | |
| 5,354,714 A | 10/1994 | Boysel | |
| 5,458,060 A | 10/1995 | Casl | |
| 5,461,781 A | 10/1995 | Pirc | |
| 5,550,622 A | 8/1996 | Tange | |
| 5,576,030 A | 11/1996 | Hooper | |
| 5,578,158 A | 11/1996 | Gutowski et al. | |
| 5,611,274 A | 3/1997 | Tani | |
| 5,632,200 A | 5/1997 | Fukai | |
| 5,649,479 A | 7/1997 | Hoffman | |
| 5,660,632 A | 8/1997 | Volpe, Jr. et al. | |
| 5,704,381 A | 1/1998 | Millan et al. | |
| 5,802,970 A | 9/1998 | Tani | |
| 5,887,312 A | 3/1999 | Curtin | |
| 5,893,325 A | 4/1999 | Sakai | |
| 6,022,192 A | 2/2000 | DaLaHoz et al. | |
| 6,237,484 B1 | 5/2001 | Homma et al. | |
| 6,267,818 B1 | 7/2001 | Volpe, Jr. | |
| 6,397,741 B1 | 6/2002 | Curtin | |
| 6,585,943 B1 | 7/2003 | Sanford et al. | |
| 6,640,712 B2 | 11/2003 | Corti et al. | |
| 6,659,002 B2 | 12/2003 | Langdon et al. | |
| 6,698,346 B2 | 3/2004 | Shimizu et al. | |
| 7,017,489 B2 | 3/2006 | Perault et al. | |
| 7,614,342 B2 | 11/2009 | Curtin et al. | |
| 7,905,239 B2 | 3/2011 | Kim | |
| 8,225,804 B2 | 7/2012 | Publ | |
| 8,281,735 B2 | 10/2012 | Curtin | |
| 2002/0170579 A1 | 11/2002 | Lammert et al. | |
| 2004/0026444 A1 | 2/2004 | DeSilva et al. | |
| 2007/0062386 A1 | 3/2007 | Curtin et al. | |
| 2007/0199578 A1 | 8/2007 | Nomura et al. | |
| 2008/0072927 A1 | 3/2008 | Weiss | |
| 2009/0133721 A1 | 5/2009 | Campbell | |
| 2009/0158943 A1 | 6/2009 | Kobayashi | |
| 2009/0217830 A1 | 9/2009 | Eppinger | |
| 2021/0016378 A1 | 1/2021 | Curtin | |

FOREIGN PATENT DOCUMENTS

| | | |
|---|---|---|
| JP | 01212492 A | 8/1989 |
| JP | 11198347 A | 7/1999 |
| JP | 2006281786 A | 10/2006 |
| NL | 7800707 A | 7/1979 |

OTHER PUBLICATIONS

IBM Technical Disclosure Bulletin, Coated Wafer Carriers, vol. 27, No. 10A, Mar. 1985, 2 pages.

IBM Technical Disclosure Bulletin, Mask Assembly and Wafer Tray, vol. 29, No. 2, Jul. 1986, 2 pages.

IBM Technical Disclosure Bulletin, Multiple Substrate Package, vol. 35, No. 4A, Sep. 1992, pp. 264-265, 3 pages.

IBM Technical Disclosure Bulletin, Multi-Purpose Tote and Insertion System for Generic Material Handling, vol. 31, No. 6, Nov. 1988, pp. 314-315, 3 pages.

IBM Technical Disclosure Bulletin, Standoff Attach Tool, vol. 32, No. 4A, Sep. 1989, pp. 72-73 3 pages.

Magna-Print Universal Squeegee Blade System, retrieved from the Internet at www.ben-technologies.com/support/wp-content/download/magna_datasheet.pdf, on Mar. 27, 2023, 2 pages.

Non-Final Office Action issued by the United States Patent and Trademark Office in related U.S. Appl. No. 16/932,147 on Nov. 2, 2023, 15 pages.

Non-Final Office Action issued by the United States Patent and Trademark Office in related U.S. Appl. No. 17/015,583 on Nov. 8, 2023, 7 pages.

Final Office Action issued by the United States Patent and Trademark Office in related U.S. Appl. No. 16/392,147 on Mar. 22, 2024, 12 pages.

Final Office Action issued by the United States Patent and Trademark Office in related U.S. Appl. No. 17/015,583 on May 16, 2024, 9 pages.

* cited by examiner

SQUEEGEE HOLDER WITH AN INTEGRATED CLAMP BAR

PRIORITY

The present application claims priority to U.S. Provisional Patent Application No. 63/438,446 filed Jan. 11, 2023, the disclosure of which is hereby incorporated by reference in its entirety.

BACKGROUND

This invention relates to solder paste printing such as printing solder paste for the assembly of electronic printed circuit board assemblies and relates in particular to solder paste surface mount technology (SMT) printers.

Within typical solder paste printers, there exist one or two squeegee blades. The squeegee blade(s) are held by a squeegee blade holder (or squeegee holder). The squeegee holder is mounted to a squeegee head that traverses a linear distance within the solder paste printer, usually inside the enclosed shell of the machine. The squeegee head is mounted to linear guides that maintain the head along a precise linear path. The squeegee head further includes actuating components that cause the squeegee blade to move up and down. In the down position, the squeegee blade is pushed with a set force against a stencil mask and pc-board combination which is held firmly during the print stroke. This down-push motion of the squeegee blade and linear movement of the head and squeegee assembly causes the squeegee blade to push a mass of solder paste across the stencil mask. The stencil mask has a distribution of apertures of various sizes and locations. As the squeegee blade pushes the solder paste across the stencil, the solder paste oozes into the apertures and gets sheared clean thereby filling the apertures precisely. At the end of each print stroke, the squeegee blade moves up and the stencil is lifted off the pc board (or conversely, the pc board is lowered from the stencil). This completes the print cycle of the machine. The pc board is then transferred out of the printer through linear rails. For the next stroke, a new pc board is shuttled in and the stencil is lowered onto it. The squeegee blade then drops down again to stroke the solder paste and repeat the printing cycle.

Figure 5:
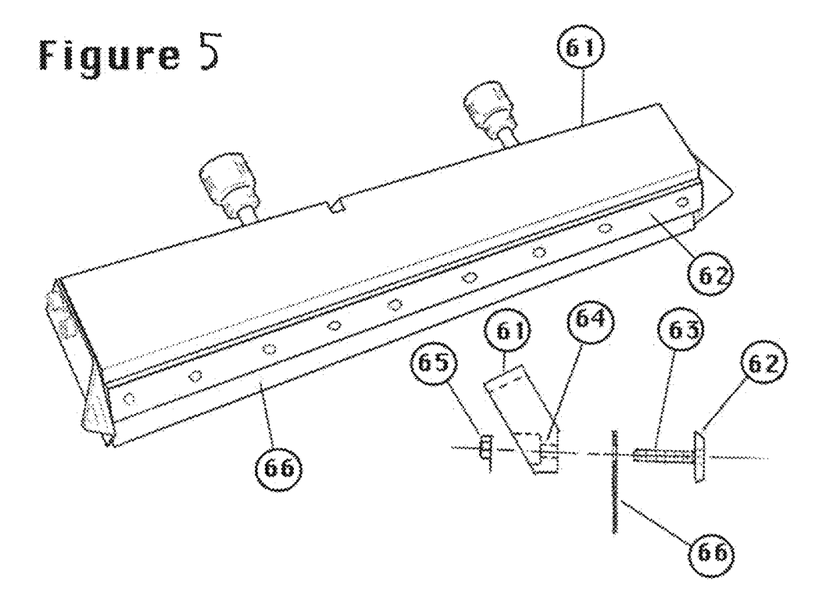
FIG. 5 shows an illustrative diagrammatic view of a prior art clamp bar system with studs welded to the clamp bar.

The squeegee blade for solder paste printing is a vital element that is known to be responsible for over 70 percent of the defects and failures associated with resulting electronic assemblies. The squeegee blades endure a significant amount of wear and abuse and need to be inspected and changed to maintain high performance of the SMT printer. The process of changing squeegee blades is a significant burden to electronic manufacturing technicians due to the current squeegee holder designs which use a series of screws that pass through a clamp bar such as disclosed in U.S. Pat. No. 5,887,312. Other designs try to keep the clamping bar/screw free from the solder paste side. FIG. 5, for example, shows a prior art design in which a squeegee clamp bar 62, has a threaded stud 63 welded to it. This stud passes through a counter bored hole in the holder 64. A nut 65 is screwed on the stud to secure the blade 66 onto the holder 61. These squeegee holders require tools to unclamp the squeegee. Often-times the features that mate with the tools get occluded by the solder paste, requiring extra cleaning before blades can be changed.

With reference again to U.S. Pat. No. 5,887,312, the heads of the clamping screws may be exposed to the solder paste and will become difficult to remove because the tool used to unscrew them will not engage completely with the matching feature of the screw head, for example if the screw is a Philips head screw, the negative cross pattern will become full of solder paste. The person who is maintaining the squeegee will then have to carefully clean the solder paste out of the screw head by means of using solvents and fine brushes. It is time consuming and tedious.

The prior art system of FIG. 5 seeks to overcome this problem by welding threaded studs to the clamp bar and manufacturing c-bore holes in the squeegee holder. This change means that a nut may be used at the rear of the squeegee holder (opposite the solder paste side), and this thereby eliminates the problem of solder paste getting in the way of the tool used to loosen the clamp point. This is also however, a more expensive and time-consuming manufacturing process: to precisely position threaded studs, weld them in place, and machine c-bore holes in the holders that match the pitch of the studs. U.S. Published Patent Appln. No. 2009/0217830 discloses another squeegee holder design that incorporates numerous screws to clamp the squeegee blade.

In all these squeegee holder systems screws or studs are used that need to be distributed along the length of the squeegee. In all these styles of squeegee holders, tools must be used by operators to effect the blade removal and reinstallation. In all cases, the clamping of the blade is predominantly achieved by multiple point-locations distributed along a line. Using just two screws would not be sufficient to hold the squeegee blades due to the flexible nature of the clamp bar. Therefore, often many screw holes are used; this is expensive to manufacture and also increases the time needed to change blades.

SUMMARY

In accordance with an aspect the invention provides a squeegee blade holder system that includes a squeegee blade holder comprising a first elongated recess on a front side of the squeegee blade holder for receiving a pivoting clamp bar in communication with a squeegee blade, and a second elongated recess on the front side of the squeegee blade holder for receiving a push bar for urging the pivoting clamp bar to capture the squeegee blade between the pivoting clamp bar and the front side of the squeegee blade holder.

In accordance with another aspect the invention provides a method of securing a squeegee blade to a squeegee blade holder. The method includes receiving a pivoting clamp bar in a first elongated recess on a front side of the squeegee blade holder, and receiving a push bar in a second elongated recess on the front side of the squeegee blade holder to capture the squeegee blade between the pivoting clamp bar and the front side of the squeegee blade holder.

In accordance with a further aspect the invention provides a squeegee blade holder system including a squeegee blade holder including a front side, a pivoting clamp bar in communication with a squeegee blade, said pivoting clamp bar being captured by the squeegee blade holder on the front side thereof such that the pivoting clamp bar is pivotable about an elongated direction of the squeegee blade holder, and a push bar for urging the pivoting clamp bar to pivot to capture the squeegee blade between the pivoting clamp bar and the front side of the squeegee blade holder.

BRIEF DESCRIPTION OF THE DRAWINGS

The following description may be further understood with reference to the accompanying drawings in which.

The drawings are shown for illustrative purposes only.

DETAILED DESCRIPTION

In accordance with various aspects, the invention provides a new type of squeegee that gives high quality squeegee clamping without the use of screws that tighten directly on the blade, or directly on a clamp bar that tightens down on the blade. This system may include as few as one locking element, but typically uses two or three locking elements, such as thumb screws or push cams. This system moves the clamping/locking function away from the solder paste so that it cannot interfere with the quality and function of the clamping action.

The system requires no tools to accomplish effective blade changes and reduces the overall number of parts and operations required for both the clamping function and the manufacture of the squeegee holder assembly. The locking devices of the invention push on linear bar, which then pushes on a pivoting clamp bar, which in turn secures the squeegee blade tightly and accurately. This system provides for a smooth surface on the solder paste side of the holder, which is easy to clean, and does not have any locking features that can be adversely affected by solder paste. This invention also eliminates the need for a series of screw positions distributed along the length of the squeegee, which reduces costs of manufacturing.

The system provides a very fast blade lock and unlock cycle (e.g., under 4 seconds) as compared to screw clamping systems that take up to 30 minutes to effectively clean, remove and reinstall a squeegee blade. The system in accordance with an aspect may use only one point for the locking, but more often will use two points for added security (backup) and may use more points if the length of the squeegee is over 14 inches. For any length of squeegee this system requires less points of clamping compared to existing squeegee holder designs to further reduce the cost of manufacturing.

This system in accordance with certain aspects also achieves a very thin profile that is light weight which are advantages for end user handling. Additionally, by removing the paste retainer on one side, the system allows the three main long components of its design (the pivot clamp bar welded assembly, the squeegee holder and the linear push bar) all to be easily separated, e.g., in less than 5 seconds. They all may be cleaned in an automated washer. Since there are no small internal areas exposed to solder paste, their cleaning is accomplished more easily and they may be wiped quickly with a cloth to complete the cleaning and drying. They may be reassembled in just the same simple manner by sliding back together and then the paste retainer is reinstalled.

Figure 1:
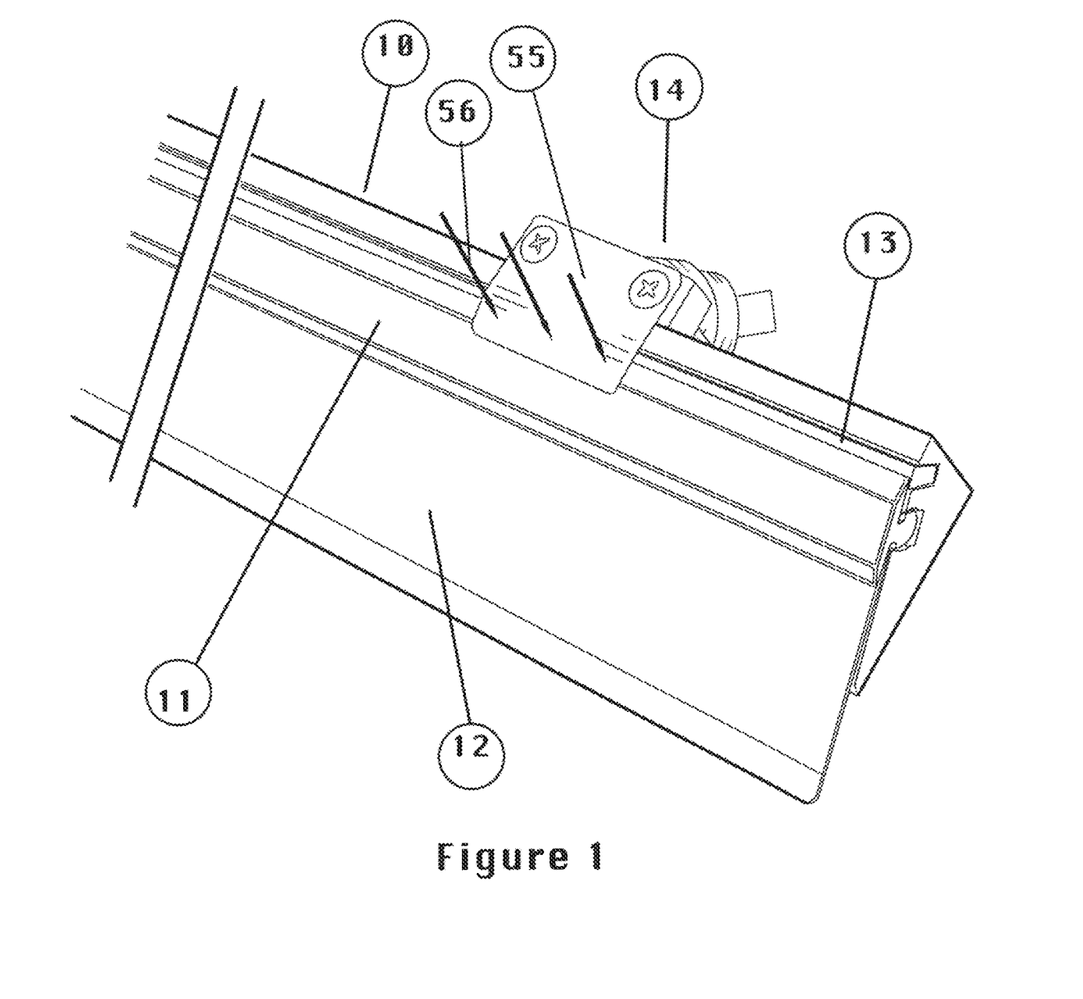
FIG. 1 shows an illustrative diagrammatic front view of a squeegee system in accordance with an aspect of the present invention.

FIG. 1 for example, shows a squeegee system in accordance with an aspect of the present invention from a paste-side (front) perspective. In this view, the main components of the invention are shown as a squeegee blade 12, a pivoting clamp bar 11, a locking mechanism 14, a push bar 13 and a squeegee holder 10. The locking mechanism has a spring plate 55 that pushes back against the top edge of the pivoting clamp bar 11 as shown by the indicating arrows 56.

Figure 2:
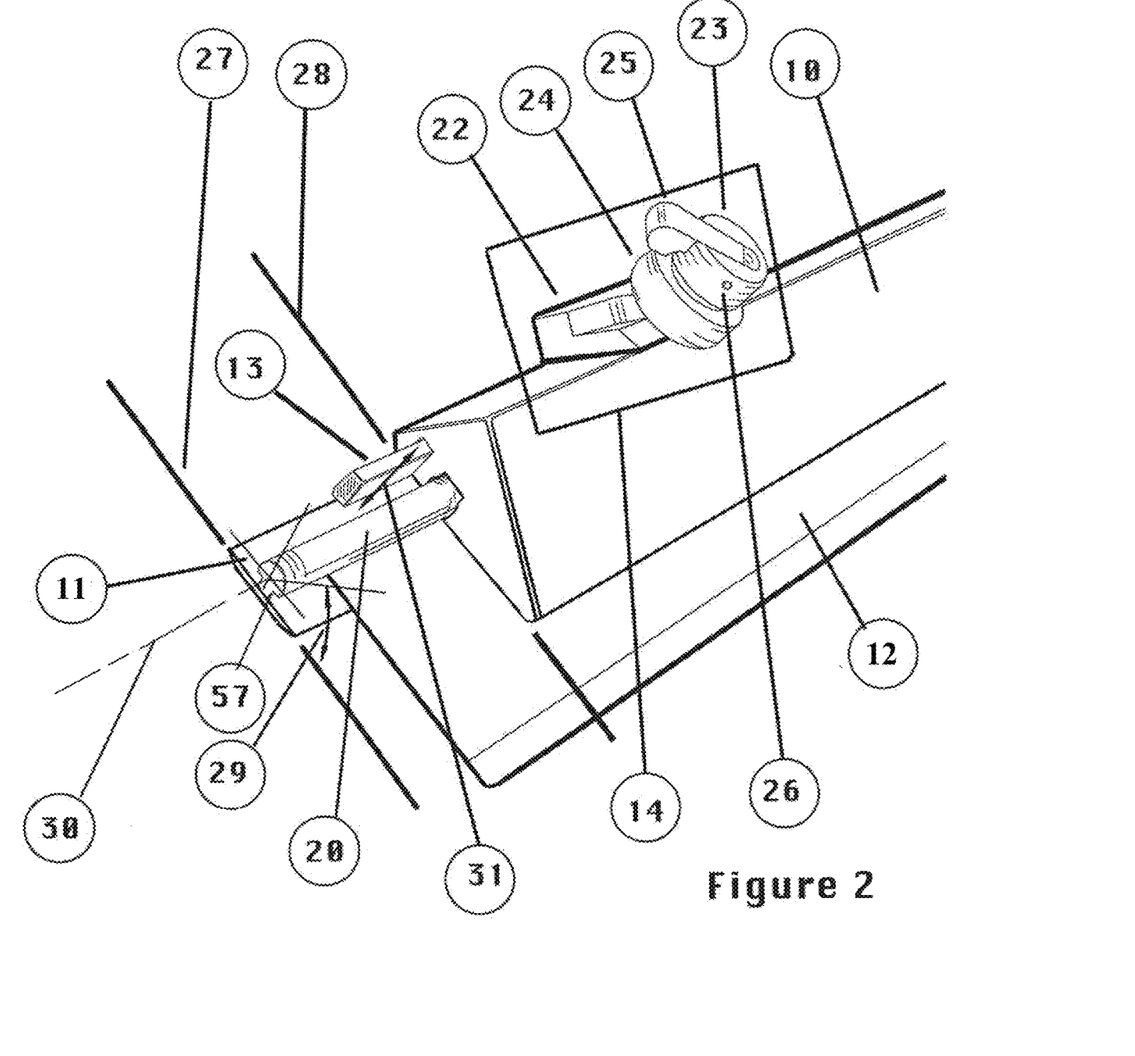
FIG. 2 shows an illustrative diagrammatic enlarged rear view of the clamping system of the squeegee system of FIG. 1.
Figure 6:
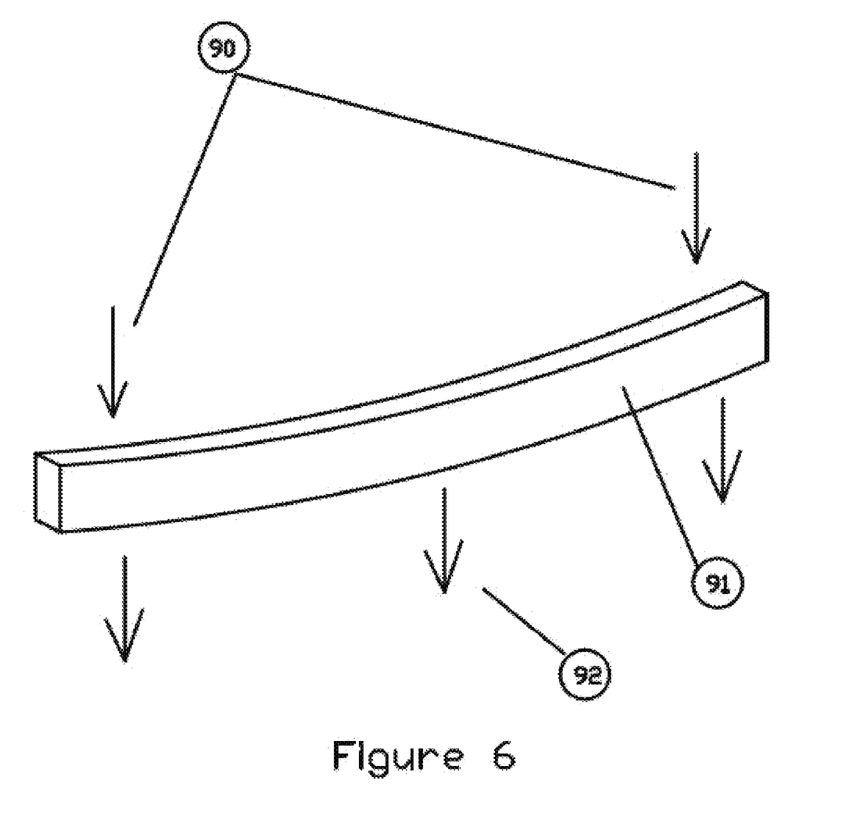
FIG. 6 shows an illustrative diagrammatic view of a push bar for use in a clamping system in accordance with a further aspect of the present invention.

FIG. 2 shows a rear side view of the squeegee system of FIG. 1 with the push bar 13 and clamp bar 11 depicted in a position that extends partially out of the squeegee holder 10 for clarity. The clamp bar 11 is attached to the pivot rod 20 as a single unit or fabricated, such as by welding or spot welding. The pivot rod can include a relief 57, such as notches machined as shown at to give the squeegee blade 12 a surface to seat against without getting stuck during assembly or disassembly. Other key features of this system include the push bar 13 having clearance in the squeegee holder 10 that permits movement as shown by the directional arrow 31. When the lock mechanism 14 is actuated, push bar 13 is moved away from the squeegee holder 10. The push bar 13 accordingly pushes the flat portion of one side of the clamp bar 11 which causes it to pivot along with rod 20 as shown by angular arrow 29 causing the flat portion on the other side of the clamp bar 11 to apply a clamping force on the squeegee 12 against the front side of the squeegee holder 10. It is noted that the push bar 13 shown here is straight along the long dimension parallel to the squeegee holder 10. As shown in FIG. 6 however, the push bar 91 may alternatively be curved as shown, so that the locking push forces indicated by arrows 90 are effectively transmitted to the middle of the pivot clamp bar at location 92 by deflection of the push bar 13.

Referring to FIG. 2, in the unlocked (unclamped) position, the clamp bar inner face alignment as indicated by first alignment line 27 is parallel to the squeegee mounting face alignment as indicated by second alignment line 28. The pivoting motion is centered on the rod axis as indicated at axis 30. The locking mechanism 14 may be a threaded assembly such as a thumb screw, or a cam-locking assembly as shown. Alternatively, locking mechanism 14 may also be provided as a ball spring plunger built into the thumb screw that only allows a set force to impinge on the push bar 13 thereby limiting the resulting force so that users do not exceed the necessary force to clamp the squeegee which could cause damage to the assembly. In this case, as the user screws the thumb screw the ball spring plunger would depress after contact with the push bar, and then the thumb screw would reach a stop point beyond which no further turning would be possible. This stop point would be caused by the seating of the head of the thumb screw against the housing 22. A thumb screw locking mechanism 14 may alternatively include a threaded locking element 24 that allows the user not only to lock the squeegee blade in the holder but then to lock the lock so that it does not loosen easily. The body of the housing 22 is the main structure that holds the push-back spring (e.g., spring plate 55 in FIG. 1), and receives the thumb screw locking element 23, screw locking element 24, and camlock lever 25. When the locking elements include the cam lock lever 25 it should be noted that that lever pivots on a cross pin axle 26.

Figure 3:
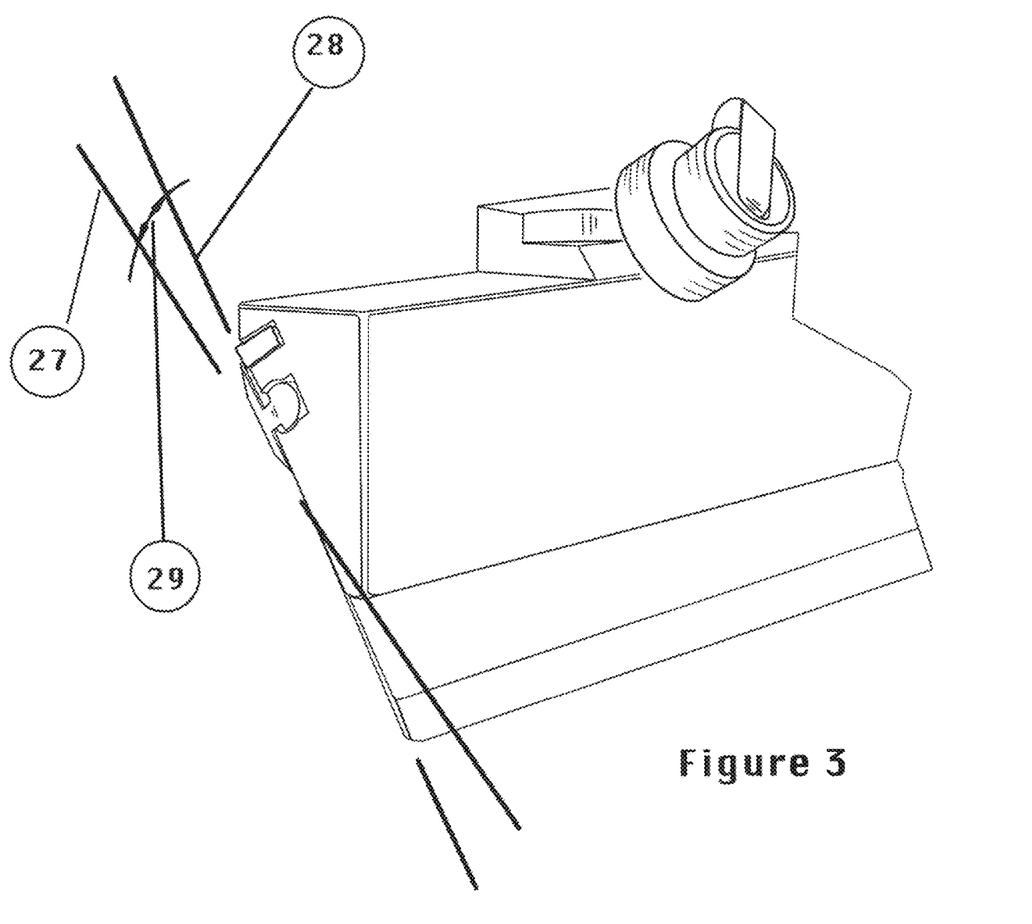
FIG. 3 shows an illustrative diagrammatic rear view of the clamping system of FIG. 2 during clamping.

FIG. 3 is a rear side view that shows the clamp bar 11 pivoted with respect to the squeegee holder mounting face, as indicated by first alignment line 27 and second alignment line 28 no longer being parallel. The angle 29 of mutual rotation between these alignment lines during clamping is typically 2.5 degrees.

Figure 4:
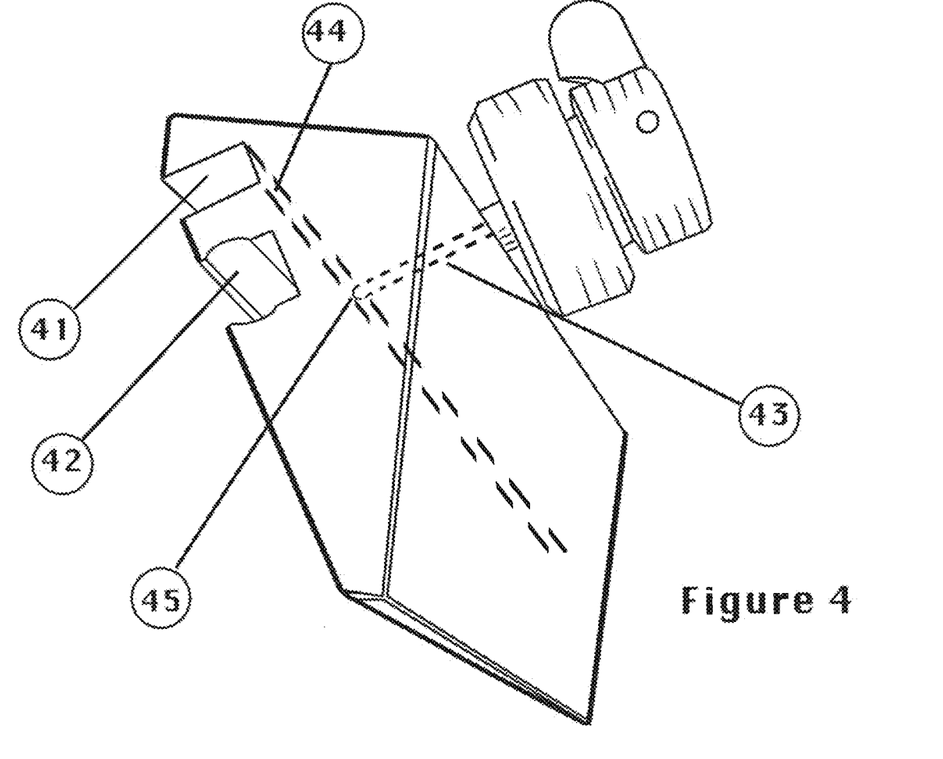
FIG. 4 shows an illustrative diagrammatic enlarged view of the clamping system of FIG. 2 showing the push element protruding into the track.

FIG. 4 shows that the locking assembly including the push element 43 such as a pin or the threaded portion of a thumb screw, is aligned to protrude on the track 44 at a contact point 45 in the center of a channel 41 in which the push bar 13 sits. FIG. 4 also shows that the squeegee holder has a ball groove channel shape 42 to receive pivot rod 20.

This system in accordance with an aspect is characterized mainly by a squeegee holder containing a pivoting clamp bar assembly, actuated by a push bar and one or more locking assemblies normally located at the ends of the squeegee holder. An advantage of this invention is that the main elements all may be manufactured as long items and then cut to various lengths for different size squeegee assemblies. The elements actuated by users to lock the blade in this invention are positioned on the rear side of the squeegee holder (opposite the paste side) and in this case, they are saved from contamination and fouling by the solder paste. This invention eliminates screws distributed along a line that are most often used for squeegee holders. This invention also provides a smooth front surface for the squeegee holder and blade and clamp bar assembly that is easier to clean and provides better printing action by not trapping and sticking with the solder paste as much as prior art devices.

Improvements provided by systems in accordance with certain aspects include the following:
1) No tools are required to lock and unlock the squeegee blade-saving time when changing blades.
2) Common construction of squeegee holder with series of screws and tapped holes-or-studs welded to clamp bar and c-bores on a pitch—is replaced by a linear element (pivot rod 20 attached to clamp bar 11)—reducing number of parts and improving cost to manufacture.
3) The front side of the clamp bar 11 is smooth and low profile, which improves the printing action of the squeegee holder and blade combination. Paste is not as susceptible to sticking to the clamp bar 11 because the screw heads and their related surface irregularities are absent.
4) Key elements of the blade unlocking function are removed from the solder paste side to the back side to keep them relatively free of contamination by the solder paste that can inhibit their function.
5) Easy disassembly for cleaning by removing paste retainer and sliding out the push bar 13, and clamp bar 11/pivot rod 20 assembly.
6) Ease of manufacture of different lengths; no need to worry about alignment and pitch of screw attachments.
7) Significant reduction of parts quantity improves overall end-user quality.

Systems and methods in accordance with certain aspects of the present invention are unique in the use of a clamp bar (with a pivot rod) where one side is pushed and the other side squeezes closed. It essentially reverses the clamping to the opposite side of the squeegee holder, where space is available, and where there is no solder paste that causes contamination and interference with the clamping apparatus. Further, by attaching a pivot rod 20 to the clamp bar 11 it increases the stiffness of the assembly, preventing flexing which gives it a stronger clamping ability.

The clamp bar 11/pivot rod 20 design is symmetric which makes it easier to assemble without worry about what edge is top or bottom. Compared to screwed clamp bars, the system allows the clamp bar to flex in the area that is not screwed. Prior art designs will sometimes incorporate an "L" shape to the clamp bar to stiffen the strength of the clamp bar and this helps but also consumes space and is asymmetric. The construction of this clamp bar 11/pivot rod 20 form a T-like structure which is symmetric and is easier to use as a result. Further, the incorporation of a push bar 13 distributes the clamping into a distributed force, impinging on the pivot clamp bar. This is an added feature that allows this assembly to reduce the number of clamp screws to just one or two (sometimes more are needed for long squeegees).

Those skilled in the art will appreciate that numerous modifications and variations may be made to the above disclosed embodiments without departing from the spirit and scope of the present invention.

What is claimed is:

1. A squeegee blade holder system including a squeegee blade holder comprising a first elongated recess on a front side of the squeegee blade holder for receiving a pivoting clamp bar in communication with a squeegee blade, and a second elongated recess on the front side of the squeegee blade holder for receiving a push bar for urging the pivoting clamp bar to capture the squeegee blade between the pivoting clamp bar and the front side of the squeegee blade holder, and a locking mechanism comprising a cam lock lever for biasing the push bar against the pivoting clamp bar.

2. The squeegee blade holder of claim 1, wherein the pivoting clamp bar includes a rounded cross-sectional portion that is received within the first elongated recess and provides a pivoting action.

3. The squeegee blade holder of claim 2, wherein the pivoting clamp bar includes a first elongated flat portion and a second elongated flat portion, each of the first elongated portion and the second elongated portion on opposing sides of the clamp bar, the first elongated portion urged away from the squeegee holder by the push bar, and the second elongated portion capturing the squeegee blade to the front side of the squeegee blade holder.

4. The squeegee blade holder of claim 3, wherein the first elongated flat portion and the second elongated flat portion are not parallel with the front side of the squeegee blade holder when the squeegee blade is captured against the second elongated flat portion.

5. The squeegee blade holder as claimed in claim 3, wherein the push bar is flat.

6. The squeegee blade holder as claimed in claim 3, wherein the push bar is curved.

7. A squeegee blade holder system comprising:
a squeegee blade holder including a front side;
a pivoting clamp bar in communication with a squeegee blade, said pivoting clamp bar being captured by the squeegee blade holder on the front side thereof such that the pivoting clamp bar is pivotable about an elongated direction of the squeegee blade holder; and
a curved push bar for urging the pivoting clamp bar to pivot to capture the squeegee blade between the pivoting clamp bar and the front side of the squeegee blade holder.

8. The squeegee blade holder as claimed in claim 7, wherein the pivoting clamp bar includes a rounded cross-sectional portion that is received within the first elongated recess and provided the pivoting action.

9. The squeegee blade holder as claimed in claim 8, wherein the pivoting clamp bar includes two elongated flat portions on either side of the clamp bar, one of which is urged away from the squeegee holder by the push bar, and the other of which urges the pivoting clamp bar to capture the squeegee blade between the pivoting clamp bar and the front side of the squeegee blade holder.

10. The squeegee blade holder as claimed in claim 9, wherein the two elongated flat portions are other than parallel with the front side of the squeegee blade holder when the push bar is secured against the pivoting clamp bar.

11. The squeegee blade holder as claimed in claim 10, wherein the squeegee blade holder further includes a locking mechanism for locking the curved push bar in an engaged position in which it pushes against the pivoting clamp bar.

12. The squeegee blade holder as claimed in claim 11, wherein the locking mechanism comprises a thumb screw.

13. The squeegee blade holder as claimed in claim 11, wherein the locking mechanism comprises a cam lock lever.

14. A squeegee blade holder system including a squeegee blade holder comprising a first elongated recess on a front side of the squeegee blade holder for receiving a pivoting clamp bar in communication with a squeegee blade, and a second elongated recess on the front side of the squeegee blade holder for receiving a curved push bar for urging the pivoting clamp bar to capture the squeegee blade between the pivoting clamp bar and the front side of the squeegee blade holder.

15. The squeegee blade holder of claim 14, wherein the pivoting clamp bar includes a rounded cross-sectional portion that is received within the first elongated recess and provides a pivoting action.

16. The squeegee blade holder of claim 15, wherein the pivoting clamp bar includes a first elongated flat portion and a second elongated flat portion, each of the first elongated portion and the second elongated portion on opposing sides of the clamp bar, the first elongated portion urged away from the squeegee holder by the curved push bar, and the second elongated portion capturing the squeegee blade to the front side of the squeegee blade holder.

17. The squeegee blade holder of claim 16, wherein the first elongated flat portion and the second elongated flat portion are not parallel with the front side of the squeegee blade holder when the squeegee blade is captured against the second elongated flat portion.

18. The squeegee blade holder as claimed in claim 17, wherein the squeegee blade holder further includes a locking mechanism for locking the curved push bar in an engaged position in which it pushes against the pivoting clamp bar.

19. The squeegee blade holder as claimed in claim 18, wherein the locking mechanism comprises a thumb screw.

20. The squeegee blade holder as claimed in claim 18, wherein the locking mechanism comprises a cam lock lever.

21. A squeegee blade holder system comprising:
a squeegee blade holder including a front side;
a pivoting clamp bar in communication with a squeegee blade, said pivoting clamp bar being captured by the squeegee blade holder on the front side thereof such that the pivoting clamp bar is pivotable about an elongated direction of the squeegee blade holder;
a push bar for urging the pivoting clamp bar to pivot to capture the squeegee blade between the pivoting clamp bar and the front side of the squeegee blade holder; and
a locking mechanism comprising a cam lock lever for locking the push bar in an engaged position in which it pushes against the pivoting clamp bar.

22. The squeegee blade holder as claimed in claim 21, wherein the pivoting clamp bar includes a rounded cross-sectional portion that is received within the first elongated recess and provided the pivoting action.

23. The squeegee blade holder as claimed in claim 22, wherein the pivoting clamp bar includes two elongated flat portions on either side of the clamp bar, one of which is urged away from the squeegee holder by the push bar, and the other of which urges the pivoting clamp bar to capture the squeegee blade between the pivoting clamp bar and the front side of the squeegee blade holder.

24. The squeegee blade holder as claimed in claim 23, wherein the two elongated flat portions are other than parallel with the front side of the squeegee blade holder when the push bar is secured against the pivoting clamp bar.

25. The squeegee blade holder as claimed in claim 21, wherein the push bar is curved.

* * * * *